United States Patent
Brown et al.

(10) Patent No.: US 6,417,526 B2
(45) Date of Patent: *Jul. 9, 2002

(54) SEMICONDUCTOR DEVICE HAVING A RECTIFYING JUNCTION AND METHOD OF MANUFACTURING SAME

(75) Inventors: Adam R. Brown; Godefridus A. M. Hurkx; Michael S. Peter; Hendrik G. A. Huizing; Wiebe B. De Boer, all of Eindhoven (NL)

(73) Assignee: Koninklijke Philips Electronics N.V., New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/288,395

(22) Filed: Apr. 8, 1999

(30) Foreign Application Priority Data

Apr. 9, 1998 (EP) .............................................. 98201133

(51) Int. Cl.[7] ..................... H01L 29/861; H01L 29/866; H01L 29/06; H01L 29/40
(52) U.S. Cl. ......................... 257/104; 257/106; 257/19; 257/18; 257/46; 438/979
(58) Field of Search .............................. 257/18, 19, 46, 257/104–106; 438/979

(56) References Cited

U.S. PATENT DOCUMENTS

| | | | | |
|---|---|---|---|---|
| 4,771,326 A | * | 9/1988 | Curran ........................ 357/34 |
| 5,084,411 A | * | 1/1992 | Laderman et al. .......... 437/131 |
| 5,293,050 A | * | 3/1994 | Chapple-sokol et al. ...... 257/17 |
| 5,342,805 A | | 8/1994 | Chan et al. ................... 117/89 |
| 5,633,179 A | * | 5/1997 | Kamins et al. ............. 438/318 |
| 5,640,043 A | * | 6/1997 | Eng et al. .................... 257/624 |
| 5,691,546 A | * | 11/1997 | Morishita .................... 257/19 |
| 5,759,898 A | * | 6/1998 | Ek et al. ...................... 438/291 |
| 6,049,098 A | * | 4/2000 | Sato ........................... 257/198 |
| 6,242,762 B1 | * | 6/2001 | Brown et al. ............... 257/104 |

* cited by examiner

Primary Examiner—Tom Thomas
Assistant Examiner—Ori Nadav
(74) Attorney, Agent, or Firm—Steven R. Biren

(57) ABSTRACT

The invention relates to a semiconductor device having a rectifying junction (5) which is situated between two (semiconductor) regions (1, 2) of an opposite conductivity type. The second region (2), which includes silicon, is thicker and has a smaller doping concentration than the first region (1) which includes a sub-region comprising a mixed crystal of silicon and germanium. The two regions (1, 2) are each provided with a connection conductor (3, 4). Such a device can very suitably be used as a switching element, in particular as a switching element for a high voltage and/or high power. In the known device, the silicon-germanium mixed crystal is relaxed, leading to the formation of misfit dislocations. These serve to reduce the service life of the minority charge carriers, thus enabling the device to be switched very rapidly. In a device in accordance with the invention, the entire first region (1) comprises a mixed crystal of silicon and germanium, and the germanium content and the thickness of the first region (1) are selected so that the voltage built up in the semiconductor device remains below the level at which misfit dislocations develop. Surprisingly, it has been found that such a device can also be switched very rapidly, even more rapidly than the known device. The absence of misfit dislocations has an additional advantage, namely that the device is very reliable. Misfit dislocations do not develop if the product of said relative deviation in the lattice constant and the thickness of the first region is smaller than or equal to 40 nm %. A safe upper limit for said product is 30 nm %.

18 Claims, 2 Drawing Sheets

SEMICONDUCTOR DEVICE HAVING A RECTIFYING JUNCTION AND METHOD OF MANUFACTURING SAME

BACKGROUND OF THE INVENTION

The invention relates to a semiconductor device having a rectifying junction, in particular on a switching diode, comprising a semiconductor body including a substrate and a first silicon semiconductor region of a first conductivity type having a high doping concentration, and a second silicon semiconductor region of a second conductivity type, which is opposite to the first conductivity type, and having a low doping concentration and a thickness which is greater than that of the first semiconductor region, said rectifying junction being situated between the first semiconductor region and the second semiconductor region, the first semiconductor region including a sub-region containing a mixed crystal of silicon and germanium, and said first and said second semiconductor region being provided with, respectively, a first and a second connection conductor. The invention also relates to a method of manufacturing such a device.

Such a device is known from United States patent specification U.S. Pat. No. 5,342,805, published on Aug. 30, 1994. Said document discloses (see, for example, FIG. 3) a diode having a semiconductor body which comprises, in succession, an n-type silicon substrate with a high doping concentration, an n-type epitaxial silicon layer, which is provided thereon and which has a relatively low doping concentration, at the surface of which there is a layer of a p-type silicon having a high doping concentration, which is formed by diffusion. At the location where the diffused region and the epitaxial layer, which form, respectively, a first and a second semiconductor region, border on each other, there is a rectifying pn-junction. The substrate forms an $n^+$ region. Consequently, the device forms a $p^+n(n^+)$ diode. Since both the $p^+$ region and the $n^+$ region are relatively thick, the profile of the charge carriers in both regions is relatively flat. As a result, diffusion currents of electrons (in the $p^+$ region) and of holes (in the $n^+$ region) are negligibly small. The current in such a diode is dominated by recombination of electrons and holes, and the current density is equal to the ratio between the overall amount of charge carriers per unit area in the n-type region and the effective service life of the charge carriers. When the diode is switched from the forward direction to the reverse direction, a depletion region has to build up, particularly in the n-type region, which involves the removal of holes. Switching typically takes place at a constant reverse current (density). In this case, the time necessary to switch off (t) the diode is proportional to the charge stored in the n-type region. If the charge carriers have a long service life, then the stored charge is large. As a result, the diode is slow. The service life of charge carriers can be reduced by introducing gold or platinum into the semiconductor body, resulting in a faster diode. In the known device, the first semiconductor region comprises, instead of or in addition to gold, a sub-region including a mixed crystal of silicon and 20% germanium, which has a thickness of 1 to 2 $\mu$m. Such a sub-region introduces a mechanical stress into the device (the mixed crystal has a lattice constant which differs from that of the rest of the device) which is so large that stress relaxation occurs, causing so-called misfit dislocations. These dislocations reduce (in the same manner as gold atoms) the service life of the (minority) charge carriers. This too results in a faster diode. The known diode has a switching time (t) of, for example, 25 nsec.

A drawback of the known device is that, although it is very fast, it is still not fast enough for specific applications, particularly for use as a switching diode for high voltages and/or high powers.

SUMMARY OF THE INVENTION

Therefore, it is an object of the invention to provide a device of the type mentioned in the opening paragraph, which has a very slow switching time, and to provide a simple method of manufacturing such a device.

To achieve this, a device of the type mentioned in the opening paragraph is characterized in accordance with the invention in that the entire first semiconductor region contains a mixed crystal of silicon and germanium, and the germanium content and the thickness of the first semiconductor region are selected so that the mechanical stress built up in the semiconductor device is smaller than or equal to the stress at which misfit dislocations are formed. It has surprisingly been found that such a diode has a much shorter switching time than the known diode. The invention is based on the following recognitions. By limiting the mechanical stress in the device by choosing a sufficiently low germanium content and/or a sufficiently small thickness of the germanium-containing layer, stress relaxation involving misfit dislocations does not occur. However, in this case the band gap of the mixed crystal of silicon and germanium is substantially smaller, not only much smaller than the band gap of silicon but also much smaller than the band gap of a relaxed mixed crystal of silicon and germanium. As a result, the concentration of minority charge carriers in the first semiconductor region, i.e. in the case of $p^+n$ diode electrons, is substantially increased. The reason for this being that the product of the concentration of minority charge carriers and the concentration of majority charge carriers, i.e. in this case the p-type doping concentration, is inversely exponentially dependent upon the band gap. Since the electron concentration in the vicinity of the connection conductor of the first semiconductor region is substantially zero, the increase of the electron concentration in the first semiconductor region causes a substantially increased electron-concentration gradient in said region. As a result, in the first ($p^+$ type) semiconductor region, the contribution of the electron-injection current to the overall current increases and may even exceed the recombination current in the second (n-type) semiconductor region. As a result, the switching time of the diode decreases. To achieve said increase of the electron concentration it is necessary, however, that the first semiconductor region is substantially entirely made of the silicon-germanium-containing material. As mentioned hereinabove, misfit dislocations are avoided by keeping the stress in the silicon-germanium region at a sufficiently low level. This is achieved by choosing the relative deviation of the lattice constant of the mixed crystal with respect to the lattice constant of the rest of the semiconductor body and/or the thickness of the silicon-germanium-containing region to be sufficiently small. Said deviation in lattice constant is directly proportional to the germanium content. The generally relatively small thickness of the first semiconductor region, which is necessary to avoid the development of misfit dislocations, has a surprising additional advantage: as a result of the small thickness of the first semiconductor region, also the gradient in the electron concentration in this region is additionally increased. This enhances the above-explained effect on the diffusion current and the recombination current. All this results in a device having a surprisingly short switching time of, for example, 3 to 9 nsec. A further important advantage of a device in accordance with the invention is that, by virtue of the absence of (misfit) dislocations, a relatively small leakage current (in the reverse direction) is achieved. The device further exhibits a relatively small voltage drop in the forward direction.

In a preferred embodiment of a device in accordance with the invention, the germanium content and the thickness of the first semiconductor region are selected so that the product of the thickness of the first semiconductor region and the relative deviation of the lattice constant of the first semiconductor region with respect to the substrate is smaller than or equal to 40 nm*percent, and preferably smaller than or equal to 30 nm*percent. It has been experimentally found that under such conditions, no or hardly any misfit dislocations occur. A further favorable consequence of the absence of misfit dislocations is that the reliability of a device in accordance with the invention is increased. This can be attributed to the fact that dislocations may give rise to degradation of the current-voltage characteristics. A germanium content of 100% means that the relative deviation of the lattice constant of the first semiconductor region with respect to a silicon substrate amounts to 4%. For a semiconductor region having a germanium content of X atom percent, X ranging between 0 and 100, the above-mentioned relative deviation is 0.X*4%.

Favorable results can be achieved with a germanium content of the first semiconductor region in the range between 10 and 30%. In this case, the maximum permissible thickness is determined by the above-discussed condition for avoiding the development of misfit dislocations. In principle, there is no lower limit to the thickness of the first semiconductor region. A very thin first semiconductor region may have the disadvantage that a fatal interaction may readily occur between the metal used for the connection conductor of the first semiconductor region and the rectifying junction. In a favorable modification, a third semiconductor region of the first conductivity type is situated between the first semiconductor region and the second semiconductor region, the thickness and doping concentration of said third semiconductor region being between the thickness and doping concentration of the first and the second semiconductor regions. In this case, the rectifying junction is formed between the second and the third semiconductor region having a thickness ranging, for example, from 0.1 to 1 $\mu$m. The third semiconductor region generally is much thinner than the second semiconductor region. By virtue thereof, the risk that an interaction takes place between the connection conductor of the first semiconductor region and the rectifying junction is very small, also when the first semiconductor region is very thin.

Preferably, the surface area of the diode, i.e. the region where the two semiconductor regions contact each other, is at least 10,000 $\mu$m$^2$, and preferably 1 to 4 mm$^2$. Such, relatively large diodes are particularly suitable for use as switching diodes for high powers. Also, the measures in accordance with the invention are particularly necessary in such a large diode, since relaxation of an excess of stress will occur sooner in such a large diode than in a (much) smaller diode. In view of the above-mentioned application(s), the thickness and the doping concentration of the second semiconductor region are preferably selected so that the breakdown voltage of the device is in the range from 50 to 1000 V. Further, the thickness and the doping concentration of the first semiconductor region are preferably selected so that, during operation of the device, the first semiconductor region is not completely depleted at the breakdown voltage. As a result, an increase of the leakage current, which may be caused by the contact between the depletion region and the connection conductor of the first semiconductor region, is avoided.

In a variant of a device in accordance with the invention, the first semiconductor region is periodically interrupted in the lateral direction, and there is a further semiconductor region of the first conductivity type at the location of said interruptions (27 in FIG. 3), which further semiconductor region has a high doping concentration and contains exclusively silicon. In such a device, the resistance of the rectifying pn-junction between the first and the second semiconductor region is reduced by a further pn-junction between the further semiconductor region and the second semiconductor region. As a result, this variant can very suitably be used for switching very high powers. In a further favorable variant, the device comprises metal atoms, preferably gold or platinum atoms. Also these metal atoms contribute to increasing the speed of the device in accordance with the invention. This variant is very suitable for devices having a very high breakdown voltage (for example 600 V). In that case, the thickness of the first semiconductor region must be very large, so that the charge stored therein is also very large. Consequently, an additional measure, aimed at increasing the speed of the device, is desirable. However, also in this case, a device in accordance with the invention has a relatively small leakage current, because the concentration of metal atoms in a device in accordance with the invention can be relatively low.

The semiconductor regions in a device in accordance with the invention are preferably embodied so as to be epitaxial layers. The substrate is preferably a heavily doped silicon substrate of the second conductivity type. If desirable, an additional epitaxial layer may be present between the second, slightly doped semiconductor region and the substrate, which additional epitaxial layer is of the same conductivity type as the second semiconductor region (and the substrate) but has a higher doping concentration.

A method of manufacturing a semiconductor device having a rectifying junction, in which method a semiconductor body is formed which comprises a substrate and a first silicon semiconductor region of a first conductivity type having a high doping concentration, and a second silicon semiconductor region of a second conductivity type, opposed to the first conductivity type, having a low doping concentration and a thickness which is much greater than that of the first semiconductor region, the rectifying junction being formed between the first semiconductor region and the second semiconductor region, and a sub-region containing a mixed crystal of silicon and germanium being formed in the first semiconductor region, and said first and said second semiconductor region being provided with, respectively, a first and a second connection conductor, characterized in accordance with the invention in that the entire first semiconductor region is embodied so as to be a mixed crystal of silicon and germanium, and the germanium content and the thickness of the first semiconductor region are selected so that the stress built up in the semiconductor device remains below a level at which misfit dislocations develop. Such a method enables devices in accordance with the invention to be obtained in a simple manner. Preferably, the thickness and the germanium content of the first semiconductor region are selected so that the product of the thickness of the first semiconductor region and the relative deviation of the lattice constant of the first semiconductor region with respect to the substrate is smaller than or equal to 40 nm*percent, and preferably smaller than or equal to 30 nm*percent. The semiconductor regions are preferably formed by means of epitaxy.

These and other aspects of the invention will be apparent from and elucidated with reference to the embodiments described hereinafter.

The Figures are diagrammatic and not drawn to scale, in particular the dimensions in the thickness direction being exaggerated for clarity. In general, semiconductor regions of the same conductivity type are hatched in the same direction.

DETAILED DESCRIPTION OF THE PREFERRED EMBODIMENT

Figure 1:
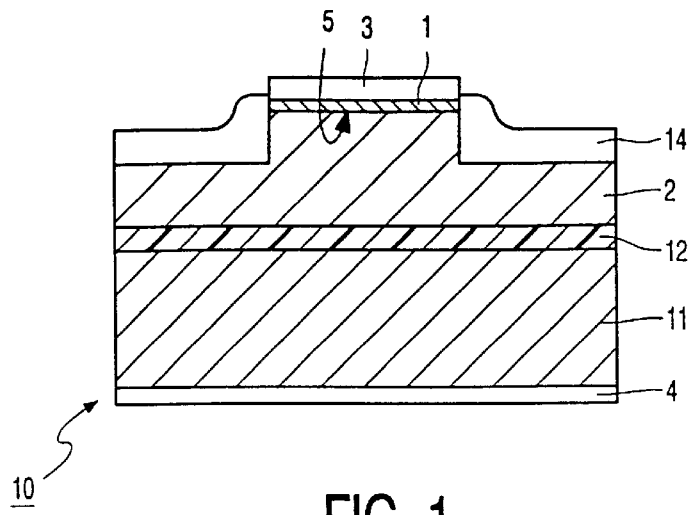
FIG. 1 is a schematic, cross-sectional view, at right angles to the thickness direction, of an embodiment of a device in accordance with the invention, FIG. 2 schematically shows the current density (I) as a function of the voltage (V) of two variants of the device shown in FIG. 1 (curves 30, 32) and of a comparable device which does not comprise germanium (curve 20)

FIG. 1 is a schematic, cross-sectional view, at right angles to the thickness direction, of a first embodiment of a device with a tunnel diode in accordance with the invention. The device comprises a semiconductor body 10 of silicon having a substrate 11, which in this case is 650 $\mu$m thick, includes antimony $n^{++}$-doped silicon and has a resistivity of 6–20 m$\Omega$cm. The semiconductor body 10 comprises a first semiconductor region 1 of a first, in this case p-, conductivity type, which includes, at least over a part of its thickness, a mixed crystal of silicon and germanium, which semiconductor region is provided with a connection conductor 3. A second, silicon-containing semiconductor region 2 of a second, opposite conductivity type, i.e. the n-conductivity type in this case, borders on said first semiconductor region, which second semiconductor region is provided, in this case via the substrate 11, with a second connection conductor 4. The doping concentration of the first semiconductor region 1 is, in this example, $1 \times 10^{19}$ at/cm$^3$, the doping concentration of the second semiconductor region 2 is $1 \times 10^{15}$ at/cm$^3$. In this example, the thickness of the second semiconductor region 2 is 8 $\mu$m. Further, in this example, a further semiconductor region 12 of the n-conductivity type, having a thickness of 100 nm and a doping concentration of $3 \times 10^{18}$ at/cm$^3$ is situated between the second semiconductor region 2 and the substrate 11, which further semiconductor region serves as a buffer layer 12 in an epitaxial growth process employed in the manufacture of the device. Said further semiconductor region 12 also contributes to a smooth switching behaviour of the device.

In accordance with the invention, the entire first semiconductor region 1 comprises a mixed crystal of silicon and germanium, and the thickness and the germanium content of the first semiconductor region 1 are selected so that the mechanical stress introduced into the semiconductor device by the mixed crystal remains below a critical stress level at which relaxation leading to misfit dislocations occurs. Surprisingly it has been found that, despite the absence of misfit dislocations enhancing the speed, such a device is still very fast. This can first of all be attributed to the fact that the band gap of a strained mixed crystal of germanium and silicon is much smaller than the band gap of pure silicon. As a result, for example in the case of a p$^+$n diode, the electron concentration in the first (p-type) region 1 is substantially increased. To achieve this, the entire first region 1 is embodied so as to be a mixed crystal of silicon and germanium. Since, in the vicinity of the connection conductor of this region, the electron concentration is substantially zero, the above implies that the gradient in the electron concentration in the first region 1 is substantially increased. As a result, the contribution of the electron-injection current to the overall current increases substantially and may even exceed the recombination current in the second region 2, so that the speed of the diode device increases. In an optimum situation, the germanium content of the first region 1 will not be too small. To avoid stress relaxation, it is necessary that the thickness of the first region 1 is relatively small. Also this small thickness contributes to a very substantial increase of the above-mentioned gradient in the (minority) charge carrier concentration, causing the speed of the device in accordance with the invention to be extraordinary. In addition, by virtue of the absence of dislocations, a device in accordance with the invention also is very reliable.

In this example, the germanium content of the first region 1 is 20%, and the thickness of the first region 1 is 20 nm. As a result, the device has a very short switching time of 3 nsec, at a current density of 10 A/cm$^2$. A germanium content of 20% means that the relative deviation of the lattice constant of the first region 1 with respect to the silicon semiconductor body 10 is approximately 0.8 (=0.2×4)%. This means that the product of said deviation and the thickness amounts to approximately 16 nm %, which is smaller than 40 nm %, i.e. the critical value of said product above which misfit dislocations may develop. A safer value of this product is approximately 30 nm %, but the value of the device in accordance with the example also remains below said value. For comparison, it is noted that a device in accordance with the invention, in which the germanium content of the first region 1 is 10% and the thickness of the first region 1 is the same, has a switching time of 9 nsec. This is still a very short switching time: in a device without a mixed crystal of silicon and germanium, and at the same thickness of the first region which, in this case, included pure silicon, a switching time of 30 nsec was measured.

The device in accordance with this example has a breakdown voltage of 80 V, which renders the device very suitable for use as a switch for high voltages and/or high powers. In this connection mention is also made of the very favorable current-voltage characteristics of a device in accordance with the invention.

Figure 2:
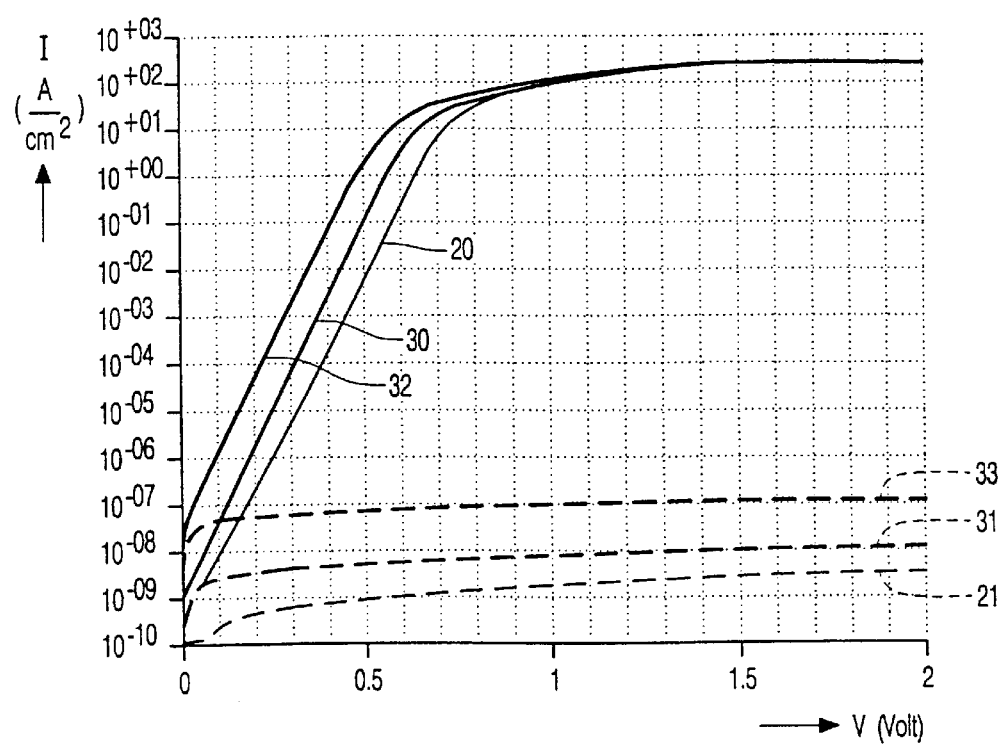

FIG. 2 schematically shows the current density (I) as a function of the voltage (V) of two variants of the device shown in FIG. 1 (curves 30, 32) and of a comparable device which does not comprise germanium (curve 20). Curves 30 and 32 correspond to the above-mentioned devices in accordance with the invention, the first region 1 having a germanium content of, respectively, 10 and 20% and a thickness of 20 nm. For comparison, curve 20 represents the corresponding trend for a device comprising 0% germanium in the first region 1, which is also 20 nm thick.

The dimensions of the device described in this example (and of devices compared therewith) are 400×400 $\mu$m$^2$. The active region, i.e. the surface of the first semiconductor region is 150×150 $\mu$m$^2$. The connection conductors 3, 4 are made of aluminium and are 100 nm thick. In a favorable variant, the first semiconductor region 1 has interruptions in the lateral direction, where there are p$^+$ regions, not shown in the Figures, which contain exclusively silicon.

The device shown in FIG. 1 is manufactured as described hereinbelow using a method in accordance with the invention. Use is made (see FIG. 1) of a (100) silicon substrate having a diameter of 6 inches on which a number of semiconductor layers are successfully provided by means of an atmospheric CVD process at a temperature of 700° C. The growth rate at said temperature is approximately 1–20 nm/min. First of all, a phosphor-doped n-type monocrystalline epitaxial layer 12 of silicon is applied. Another epitaxial layer 2 of an n-type silicon and a further epitaxial layer 1 of silicon-germanium are applied to said layer by adding germanium to the silane used for epitaxy. Subsequently, in another reactor, an oxide layer, which is not shown in FIG. 1, is provided by means of plasma CVD, which oxide layer, after it has been patterned, serves as a masking layer for etching the mesa shown in FIG. 1. For etching use is made of a potassium-hydroxide-based etchant, and the etching operation extends, in the depth direction, beyond the pn-junction 5. The flanks of the mesa are subsequently covered with a passivating layer 14 comprising silicon dioxide, which is applied by means of PECVD (=Plasma Enhanced Chemical Vapor Deposition). Next, the mask is removed and, by means of vapor deposition and patterning, the connection conductor 3 is provided on the further epitaxial layer 1, which now constitutes the first semiconductor region 1 of the device. The other epitaxial layer 2 constitutes the second semiconductor region 2 of the device. The connection conductor 4 of the second semiconductor region 2 is formed by vapor deposition on the lower side of the substrate 11. The dimensions, conductivity types, doping concentrations and compositions of the various layers and/or regions are selected as described hereinabove. Finally, by means of cutting in two mutually perpendicular directions, an individual device in accordance with the invention is obtained which is ready for final assembly. The above-mentioned variant with interruptions in the first semiconductor region 1 is made, for example, by locally removing, after the provision of the first semiconductor region 1 in the form of an epitaxial layer 1, this epitaxial layer and forming at these locations, for example by means of boron-ion implantation, the further $^+$ region which includes pure silicon.

Figure 3:
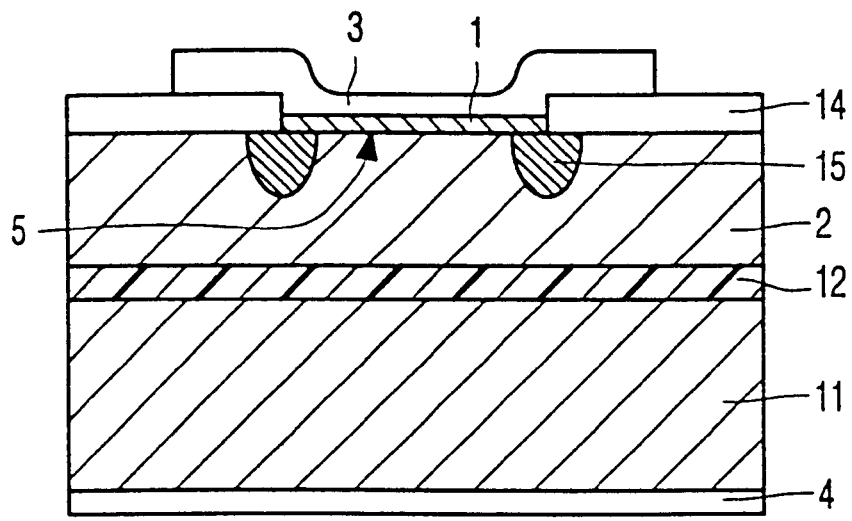
FIG. 3 is a schematic, cross-sectional view at right angles to the thickness direction, of a further embodiment of a device in accordance with the invention.
Figure 4:
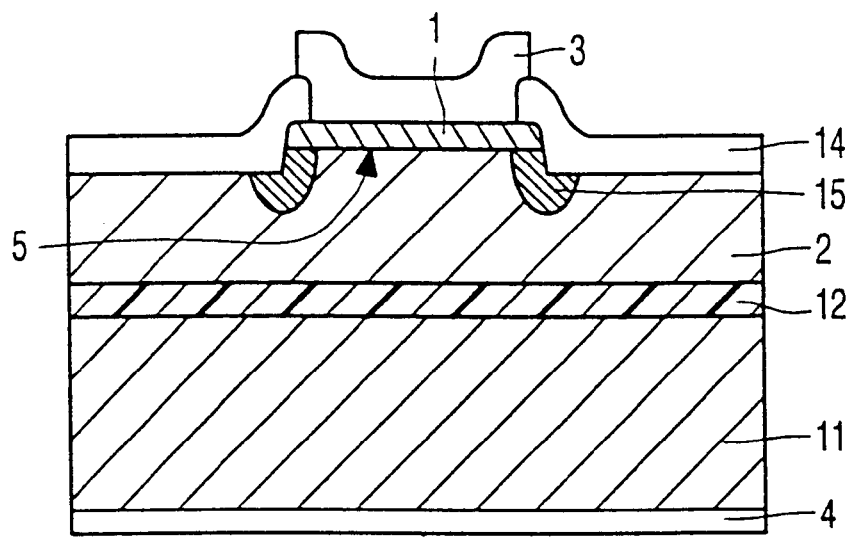
FIG. 4 is a schematic, cross-sectional view at right angles to the thickness direction, of a still further embodiment of a device in accordance with the invention.

FIGS. 3 and 4 show a schematic, cross-sectional view, at right angles to the thickness direction of a further and still further embodiment of a device in accordance with the invention.

In both these embodiments a p$^+$-type guarding 15 is encorporated in order to prevent edge-breaddown and/or to reduce the leakage current.

The FIG. 3 embodiment is fully planar which is more convenient to make. The FIG. 4 embodiment combines a mesa structure with a guarding which results in a still better protection against edge breakdown and still lower leakage current.

The guarding 15 is provided after epitaxial growth of layer 2 and preferably after provision of layer 1.

In the FIG. 3 embodiment layer 1 is provided by selective epitaxy after the provision of passivating layer 14. In the FIG. 4 embodiment the semiconductor layer 1 may still be a blanket epitaxial layer 1 which is partly removed together with a part of the guarding 15 when the mesa structure is formed. The p$^+$-type guarding 15 is preferably made by ion implantation.

The invention is not limited to the above examples and, within the scope of the invention, many modifications and variations are possible to those skilled in the art. For example, the compositions and thicknesses of the different (semiconductor) regions or layers may differ from those mentioned in the examples. It is also possible to use deposition techniques other than those mentioned hereinabove, such as MBE (=Molecular Beam Epitaxy). It is also possible to simultaneously change all conductivity types into the opposite conductivity types. Also the structure and manufacture of the device in accordance with the example may be subject to many modifications. Apart from a mesa structure use can also be made of a planar structure with a so-called guard ring. Instead of applying the first semiconductor region throughout the surface of the semiconductor body, it may alternatively be applied by means of selective epitaxy.

Although the invention particularly relates to so-called discrete devices, a device in accordance with the invention may also be a device which is more complex than a single diode-comprising device. An example of such a device is the above-mentioned variant with interruptions in the first semiconductor region.

What is claimed is:

1. A semiconductor diode having a rectifying junction (5), comprising a semiconductor body (10) including a substrate (11) and a first silicon semiconductor region (1) of a first conductivity type having a high doping concentration, and a second silicon semiconductor region (2) of a second conductivity type, which is opposite to the first conductivity type, having a low doping concentration and a thickness which is greater than that of the first semiconductor region (1), said rectifying junction (5) being situated between the first semiconductor region (1) and the second semiconductor region (2), the first semiconductor region (1) including a sub-region containing a mixed crystal of silicon and germanium, and said first and said second semiconductor regions (1, 2) being provided with, respectively, a first and a second connection conductors (3, 4), characterised in that the entire first semiconductor region (1) contains a mixed crystal of silicon and germanium, and the germanium content and the thickness of the first semiconductor region (1) are selected so that the mechanical stress built up in the semiconductor device remains below a level at which misfit dislocations are formed, and in that a third semiconductor region of the first conductivity type is located between the first semiconductor region (1) and the second semiconductor region (2), the thickness and doping concentration values of said third semiconductor region being between the thickness and doping concentration values of the first and the second semiconductor regions.

2. A semiconductor diode as claimed in claim 1, characterised in that the germanium content and the thickness of the first semiconductor region (1) are selected so that the product of the thickness of the first semiconductor region (1) and the relative deviation of the lattice constant of the first semiconductor region (1) with respect to the substrate (11) is a positive value smaller than or equal to 40 nm(%).

3. A semiconductor diode as claimed in claim 1, characterised in that the germanium content of the first semiconductor region (1) ranges between 10 and 30 at.%.

4. A semiconductor diode as claimed claim 1, characterised in that the first semiconductor region (1) is periodically interrupted in the lateral direction, and a further semiconductor region of the first conductivity type s situated within at least one location of the Interruptions of the first semiconductor region (1), the further semiconductor region has a higher doping concentration than the doping concentration of the first semiconductor region (1) and comprises exclusively silicon.

5. A semiconductor diode as claimed in claim 1, characterised in that the semiconductor device (10) comprises metal atoms.

6. A semiconductor diode as claimed in claim 1, characterised in that the substrate (11) comprises a heavily doped silicon substrate (11) of the second conductivity type, on which, in succession, the second and the first semiconductor regions (2, 1) are situated in the form of epitaxial semiconductor layers (2, 1).

7. A semiconductor diode as claimed in claim 2, characterised in that the germanium content of the first semiconductor region (1) ranges between 10 and 30 at.%.

8. A semiconductor diode as claimed in claim 7, characterised in that a third semiconductor region of the first conductivity type is situated between the first semiconductor region (1) and the second semiconductor region (2), the thickness and doping concentration values of said third semiconductor region being between the thickness and doping concentration values of the first and the second semiconductor regions.

9. A semiconductor diode as claimed in claim 3, characterised in that a third semiconductor region of the first conductivity type is located between the first semiconductor region (1) and the second semiconductor region (2), the thickness and doping concentration values of said third semiconductor region being between the thickness and doping concentration values of the first and the second semiconductor regions.

10. A semiconductor diode as claimed in claim 2, characterised in that a third semiconductor region of the first conductivity type is located between the first semiconductor region (1) and the second semiconductor region (2), the thickness and doping concentration values of said third semiconductor region being between the thickness and doping concentration values of the first and the second semiconductor regions.

11. A semiconductor diode as claimed in claim 2, characterised in that the first semiconductor region (1) is periodically interrupted in the lateral direction, and a further semiconductor region of the first conductivity type is situated within at least one location of the interruptions of the first semiconductor region (1), the further semiconductor region has a higher doping concentration than that of the first semiconductor region (1) and comprises exclusively silicon.

12. A semiconductor diode as claimed in claim 2, characterised in that the semiconductor device (10) comprises metal atoms.

13. A semiconductor diode as claimed in claim 2, characterised in that the substrate (11) comprises a heavily doped silicon substrate (11) of the second conductivity type, on which, in succession, the second and the first semiconductor region (2, 1) are situated in the form of epitaxial semiconductor layers (2, 1).

14. A semiconductor diode as claimed in claim 1, characterised in that the germanium content and the thickness of the first semiconductor region (1) are selected so that the product of the thickness of the first semiconductor region (1) and the relative deviation of the lattice constant of the first semiconductor region (1) with respect to the substrate (11) is a positive value smaller than or equal to 30 nm(%).

15. A semiconductor diode as claimed in claim 1, characterised in that the semiconductor device (10) comprises gold atoms.

16. A semiconductor diode as claimed in claim 1, characterised in that the semiconductor device (10) comprises platinum atoms.

17. A semiconductor diode as claimed in claim 2, characterised in that the semiconductor device (10) comprises gold atoms.

18. A semiconductor diode as claimed in claim 2, characterised in that the semiconductor device (10) comprises platinum atoms.

* * * * *